(12) United States Patent
Diehl (10) Patent No.: US 11,132,021 B2
(45) Date of Patent: Sep. 28, 2021

(54) ADVANCED ERGONOMIC HOUSING FOR ELECTRONIC DEVICES

(71) Applicant: Gordon J. Diehl, East Setauket, NY (US)

(72) Inventor: Gordon J. Diehl, East Setauket, NY (US)

( * ) Notice: Subject to any disclaimer, the term of this patent is extended or adjusted under 35 U.S.C. 154(b) by 0 days.

(21) Appl. No.: 16/830,722

(22) Filed: Mar. 26, 2020

(65) Prior Publication Data
US 2020/0225700 A1    Jul. 16, 2020

Related U.S. Application Data

(63) Continuation of application No. 15/581,293, filed on May 1, 2017, now Pat. No. 11,003,210.

(51) Int. Cl.
G06F 1/16 (2006.01)
H05K 5/00 (2006.01)
H05K 5/02 (2006.01)

(52) U.S. Cl.
CPC ............ G06F 1/1628 (2013.01); H05K 5/00 (2013.01); H05K 5/0086 (2013.01); H05K 5/023 (2013.01)

(58) Field of Classification Search
None
See application file for complete search history.

(56) References Cited

U.S. PATENT DOCUMENTS

| | | | | |
|---|---|---|---|---|
| 6,008,983 A * | 12/1999 | Yen | ........................ | G06F 1/1616 248/917 |
| 6,191,940 B1 * | 2/2001 | Ma | ........................ | F16M 11/10 248/917 |
| 7,149,080 B2 * | 12/2006 | Jackson, Jr. | .............. | G06F 1/16 361/679.21 |
| 7,299,580 B2 * | 11/2007 | Wang | ..................... | F16M 11/10 248/461 |
| 7,450,372 B2 * | 11/2008 | Lin | ........................ | G06F 1/1626 361/679.55 |
| 7,614,595 B2 * | 11/2009 | Richter | ................ | B60R 11/0241 248/309.1 |
| 7,950,617 B2 * | 5/2011 | Zhu | ........................ | F16M 13/005 248/469 |
| 7,967,269 B2 * | 6/2011 | Liu | ........................ | G03B 21/58 248/287.1 |
| 7,986,514 B2 * | 7/2011 | Wang | ................... | H04M 1/0247 361/679.02 |
| 8,240,628 B2 * | 8/2012 | Huang | .................... | F16M 13/00 248/316.1 |
| 8,328,153 B2 * | 12/2012 | Yang | ........................ | F16M 11/38 248/370 |
| 8,416,559 B2 * | 4/2013 | Agata | ..................... | G06F 1/1613 361/679.09 |
| 8,659,893 B2 * | 2/2014 | Chiou | .................... | G06F 1/1628 361/679.55 |
| 8,873,225 B2 * | 10/2014 | Huitema | ................ | G06F 1/1656 361/679.01 |
| 9,188,457 B2 * | 11/2015 | Wikel | ................ | G01C 21/3667 |
| 9,220,327 B2 * | 12/2015 | Hsu | ........................ | H04B 1/3877 |

(Continued)

*Primary Examiner* — Anthony Q Edwards
*Assistant Examiner* — Rashen E Morrison
(74) *Attorney, Agent, or Firm* — Peter J. Esser (57) ABSTRACT

An advanced ergonomic housing for electronic devices providing greatly superior functionality and usability by means of a multiplicity of integral, selectable, and adjustable grasping, mounting, and supporting points.

1 Claim, 8 Drawing Sheets

(56) References Cited

U.S. PATENT DOCUMENTS

| | | | |
|---|---|---|---|
| 9,304,549 B2 * | 4/2016 | Siddiqui | G06F 1/1679 |
| 9,328,865 B2 * | 5/2016 | Briant | F16M 11/38 |
| 9,400,078 B1 * | 7/2016 | McGowan | F16M 13/04 |
| 9,408,317 B1 * | 8/2016 | Luo | F16M 11/046 |
| 9,447,620 B2 * | 9/2016 | Park | E05D 11/1064 |
| D769,865 S * | 10/2016 | Oakley | D14/341 |
| 10,152,086 B2 * | 12/2018 | Choi | G06F 1/1652 |
| 2005/0239261 A1 * | 10/2005 | Tai | H05K 3/365 |
| | | | 438/380 |
| 2006/0050471 A1 * | 3/2006 | Chen | G06F 1/1601 |
| | | | 361/679.22 |
| 2006/0278788 A1 * | 12/2006 | Fan | F16M 13/02 |
| | | | 248/309.1 |
| 2008/0253067 A1 * | 10/2008 | Liou | H05K 5/02 |
| | | | 361/679.21 |
| 2010/0038514 A1 * | 2/2010 | Yu | G06F 1/1601 |
| | | | 248/449 |
| 2010/0051771 A1 * | 3/2010 | Huang | F16M 13/00 |
| | | | 248/289.11 |
| 2010/0259463 A1 * | 10/2010 | Sip | H04M 1/0247 |
| | | | 345/1.3 |
| 2011/0130782 A1 * | 6/2011 | Kan | A61B 5/15146 |
| | | | 606/182 |
| 2011/0260014 A1 * | 10/2011 | Chen | F16M 11/10 |
| | | | 248/157 |
| 2012/0168323 A1 * | 7/2012 | Schmidt | H04M 1/04 |
| | | | 206/45.24 |
| 2012/0224323 A1 * | 9/2012 | Yang | F16M 11/041 |
| | | | 361/679.55 |
| 2012/0300394 A1 * | 11/2012 | Norfolk | G06F 1/1628 |
| | | | 361/679.55 |
| 2013/0206942 A1 * | 8/2013 | Trotsky | F16M 11/10 |
| | | | 248/274.1 |
| 2014/0124521 A1 * | 5/2014 | Brown | H05K 5/03 |
| | | | 220/756 |
| 2015/0163929 A1 * | 6/2015 | Wang | H05K 5/023 |
| | | | 361/679.01 |
| 2015/0244408 A1 * | 8/2015 | Chen | H04B 1/3888 |
| | | | 455/575.8 |
| 2016/0216737 A1 * | 7/2016 | Hayk | G06F 1/1626 |
| 2017/0295656 A1 * | 10/2017 | Tsai | F16M 13/04 |
| 2018/0317332 A1 * | 11/2018 | Diehl | G06F 1/1628 |

* cited by examiner

ADVANCED ERGONOMIC HOUSING FOR ELECTRONIC DEVICES

CROSS REFERENCE TO RELATED INVENTIONS

The present invention is related to the following application: Improved Enclosure for Electronic Devices, Ser. No. 15/582,293.

This application is a divisional of application Ser. No. 15/581,293, filed May 1, 2017, which is hereby incorporated by reference.

BACKGROUND OF THE INVENTION

The present invention relates to end-product factory original electronic equipment. Specifically, the present invention centers on the physical housing structures enclosing and containing the electronic components such as batteries, circuitry, optical components, sensors, and other parts that together make up electronic devices such as mobile phones and tablet-type computers. More specifically, the invention pertains to a highly ergonomic and functional original housing for portable electronic devices including tablet computers, mobile phones, and other similar mobile portable devices.

Portable electronic devices such as mobile telephones, notebook computers, and similar gear are inherently vulnerable to physical shock, breakage, and other related damage. Such devices are more likely than less portable or non-portable devices to be accidentally dropped, scratched, or otherwise damaged. Depending on the severity of accidental contact or impact, the device may require costly and time-consuming repairs, or may be rendered entirely useless. As designers seek to create ever more functional, more visually striking, and otherwise more appealing devices, what is often overlooked is the greater functionality and overall resistance to accidental damage that would otherwise optimize the functionality as well as the lifespan of such devices. In connection with this, one common downside to the evolving phenomenon of devices being fitted with ever-larger displays is a relative lack of suitable—and ergonomic—grasping points. This has given rise to a number of after-market solutions intended to increase the functionality and ergonomics of devices, such as "selfie sticks" and shock-absorbing protective cases. These aftermarket solutions address some issues raised by original product designs, but add expense for the consumer, and often not very durable, and in most cases add considerable bulk and weight and can otherwise be inconvenient to the user.

Returning to the problem of evolving device designs and ever-larger display screens, increasingly, device display screens occupy nearly the entire frontal surface of phones, pads, and similar devices, with the typical device screen bezel diminishing in size with each new generation of device. In some instances, displays dominate the front side of a device and extend over to the edges of a device as in the case of curved displays. This forces users to hold devices by their edges to have full access to images displayed on screens, or to otherwise have a less than firm hold on the device when, for example, playing device-based games, using the device to capture still or motion images, or otherwise manipulating the device in a manner that requires a minimum of contact with the front display screen, front camera, or rear optics.

One negative outcome of this development in device technology is the limitation presented by the need to actually grasp a device in order to operate it. When a user holds such a device, the imagery or data displayed on the screen is easily partly obscured by the user's own fingers. Similarly, a cumbersome and less than secure grip may be required to utilize a device's photographic capabilities. Accordingly, users often change grips or grasp the devices by their edges or otherwise manipulate the devices in a way that increases the risk of losing a firm grip and potentially dropping the device.

Also, for certain applications such as recording video with such devices, it is nearly impossible to maintain a steady grasp on the device for prolonged durations, as the only suitable grasping points are the general perimeter of the rear side or front bezel of the housing of such devices.

As mentioned previously, aftermarket accessories can be used to enhance the functionality and capabilities of virtually any device. Ideally, a protective case will serve to protect a device, may provide added functionality to a device, and should be as unobtrusive and ergonomic as possible, while concurrently offering value in terms of purchase price and longevity. At present, however, there are no device designs which inherently provide a high degree of protection for the electronics and other components independent of a given device's immediate, factory-assembled housing, which concurrently provide a high degree of ergonomics and added functionality.

Therefore, there is a need for original factory housings for portable electronic devices, integral to the design of these devices, that will not only enclose and protect the sensitive electronics at the heart of such devices, but which can at the same time enhance the ergonomics, functionality, and usability of the devices.

SUMMARY OF THE INVENTION

The invention comprises a multifunction housing of modular construction for electronic devices providing the device end user with greatly improved functionality and stability, a higher degree of tactile response as compared to standard device housings, and significantly greater gripability—and attendant increased product longevity—of an electronic device, with physical protection against impact and other physical damage being enhanced, due to the improved hold and handling options presented to the end user by the multiple grips and handles.

The essential design of the advanced ergonomic housing entails in part mated housing members for enclosing the battery, circuitry, screen, and other sensitive components of an electronic device. Also part of the advanced ergonomic housing are integral, slidably deployable friction-fitted handles that concurrently may serve as mounting points and which may be selectively deployed and locked in an open, partially open, or retracted and closed position relative to the housing members. The advanced ergonomic housing fully encases the internal components of an external as the front, rear, and side surfaces of an electronic device as an original equipment component. By means of engaging and selectively deploying the handles, the operator of the electronic device may choose from numerous options in terms of handling and positioning the electronic device with an unusually high degree of stability and firm grip. The operator may also orient and statically place the electronic device on a horizontal or vertical surface in a variety of positions such as a substantially horizontal or also a substantially vertical position, with a range of angles being achieved by engaging the various handle-mount components integrated in the rear of the housing.

By deploying one or more of the handles, the invention further permits for mounting the device on a wall or hanging the device from any other suitable surface in a horizontal or vertical orientation in either a landscape or portrait orientation.

The invention presents an extreme degree of image stabilization functionality to the operator of the electronic device. This results from the housing incorporating bilaterally symmetrical handle-mounts integrated in the sides of the housing and a top handle-mount which is located along the top edge and orthogonal to the side-positioned handle-mounts. The operator may, by deploying one or several of the handle-mounts, maintain an exceptionally firm and steady grasp on the electronic device, suitable for purposes of employing the electronic device as a substantially motion-stabilized video camera, or even for greater ease in playing games or engaging in other activities normally associated with the aforementioned electronic devices. Especially in the case of the former application, a key benefit is that the end or side fields of the electronic device screen are not obscured by the user's fingers, as would normally be the case.

The great advantage of the invention is that a broad range of possible static placements of the electronic device may be achieved securely and with extreme ease of operation. A further advantage of the invention is that it enables the operator of an electronic device to grasp and otherwise manipulate the device with an extremely secure grip in a broad range of orientations. Another advantage of the invention is that the improved ability of the end user to firmly grasp the device and deploy the device in various handle and grip configurations provides a high degree of protection against accidental physical damage—as that caused by dropping a mobile phone or the like—to the device. Yet another significant advantage of the invention is that it may be produced according to multiple methods of manufacture, such as machining from solid stock materials, injection molding, casting, stamping, or additive deposition of material, as in digital printing.

The invention comprises seven basic components:

1. The front housing section 10
   Consists of a frontal containment portion including components for inputs and outputs, a screen, and associated screen bezel, and associated peripherals hardware. The front housing section is a core element of the overall housing, mating seamlessly with the housing forming the rear of the device.

2. The rear housing section 20
   Forms a rear housing member and establishes receiving channels for the mounting of slidably-affixed side handle-mounts 60, top handle 40, and handgrip-strut 50. Provides a solid backing to the device's electronic components, and provides rail members which engage positively with side- and top-handle-mount members and handgrip-strut member friction members 70 for gradual deployment and firm locking of side- and top-handle-mount members and handgrip-strut member.

3. The rear housing interior plate 30
   Provides receiving surfaces for various movable elements of the inventive device.

4. The lens aperture 31
   Provides for the inclusion of optics, such one or more camera lenses, in the overall device design. The lens aperture can be incorporated as a single aperture, to accommodate one optic lens, or as a multiplicity of such apertures, to accommodate multiple camera lenses of various characteristics.

5. The top handle-mount 40
   Provides a means for stably grasping, mounting, hanging, or otherwise manually gripping or statically positioning the electronic device, including at an angle, for example for facilitating typing or other text entry.

6. The handgrip-strut 50
   Provides a means for stably grasping, mounting, hanging, or otherwise manually gripping or statically positioning the electronic device, such as when a device is used in still or video camera mode.

7. The side handle-mounts 60
   Provide a means for stably grasping, mounting, hanging, or otherwise manually gripping or statically positioning the electronic device, such as when a device is used to read text such as that presented in e-book formats, or when the device is employed for text entry or other typing.

8. The friction members 70
   These members consist of substantially rigid yet slightly flexible components characterized by wave-form detents forming regular, ridged surfaces which interconnect with mating surfaces integral to the interior face of the housing backing plate 20, enabling the side- and top-handle-mount members and handgrip-strut member to be manipulated by the device user in a graduated range of proximal and distal travel, thereby permitting the selective deployment of one or both side handle-mounts, the handgrip-strut, and the top handle-mount.

The current invention seeks to provide a superior ergonomic and multifunction housing for the inner electronics of a mobile phone, handheld computer, or similar device, produced as original equipment. This system provides the added advantage of containing and protecting the enclosed inner components of a device while obviating the need for additional peripheral equipment for purposes of providing a steady, motion-free base such as a tripod for use when the device is engaged in, for example, a photography or video recording mode.

Various appropriate materials may be used for the bodies of the various modules including but not limited to: thermoplastics, polymers, thermosetting polymers, fiberglass, fiber reinforced recycled plastics, and metals, all of which may be formed or machined according to various techniques suitable to the materials.

BRIEF DESCRIPTION OF THE DRAWING

The following drawings are attached in explanation of the invention, the features of which are referenced within the detailed description of the invention. Elements in the drawing figures are not necessarily drawn to scale. Note that, although the example presented of the housing is generally rectangular as illustrated throughout the following drawings, said shape may be of any practicable multi-sided geometry suitable for enclosing a range of electronic devices.

FIG. 1 depicts the invention with all handle-mounts and the handgrip-strut in their "home" or retracted positions, as opposed to being protracted.

DETAILED DESCRIPTION OF THE INVENTION

Figure 1:
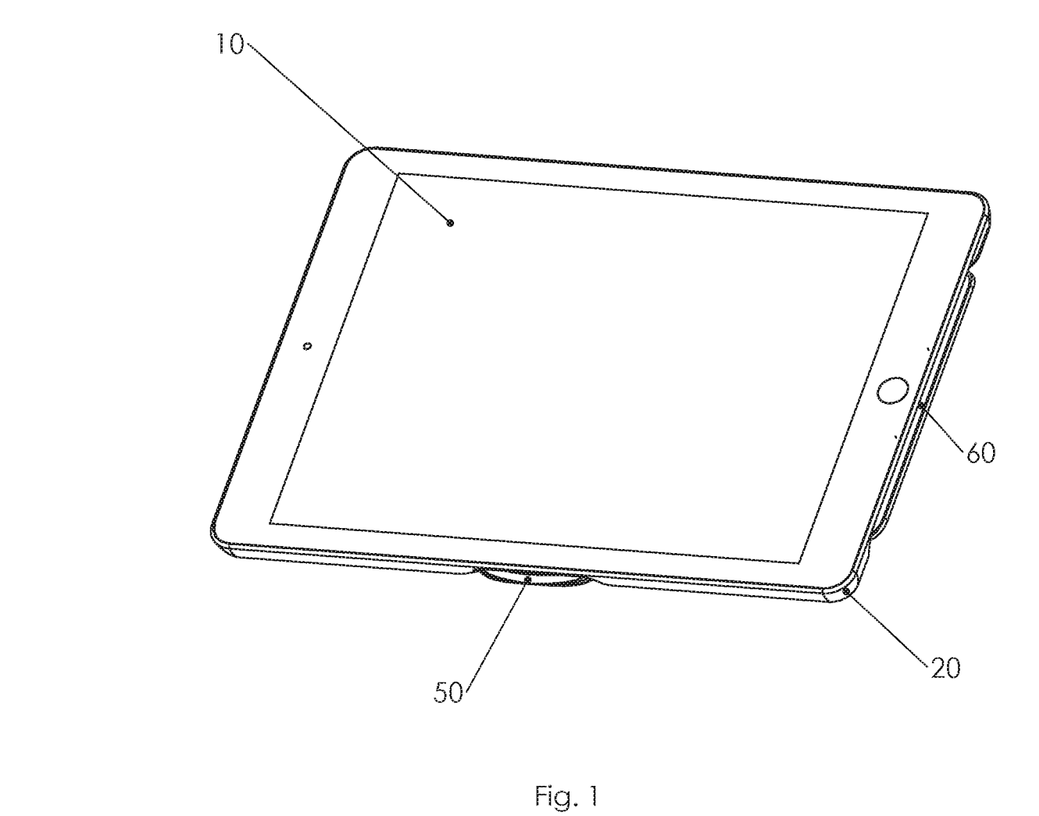
FIG. 1: This figure presents a top view of the entire invention showing constituent elements including 10, 20, 50, and 60, assembled as a unit which following final assembly would fully enclose the inner components of an electronic device such as a phone, pad-type computer, or similar device. Importantly.
Figure 2:
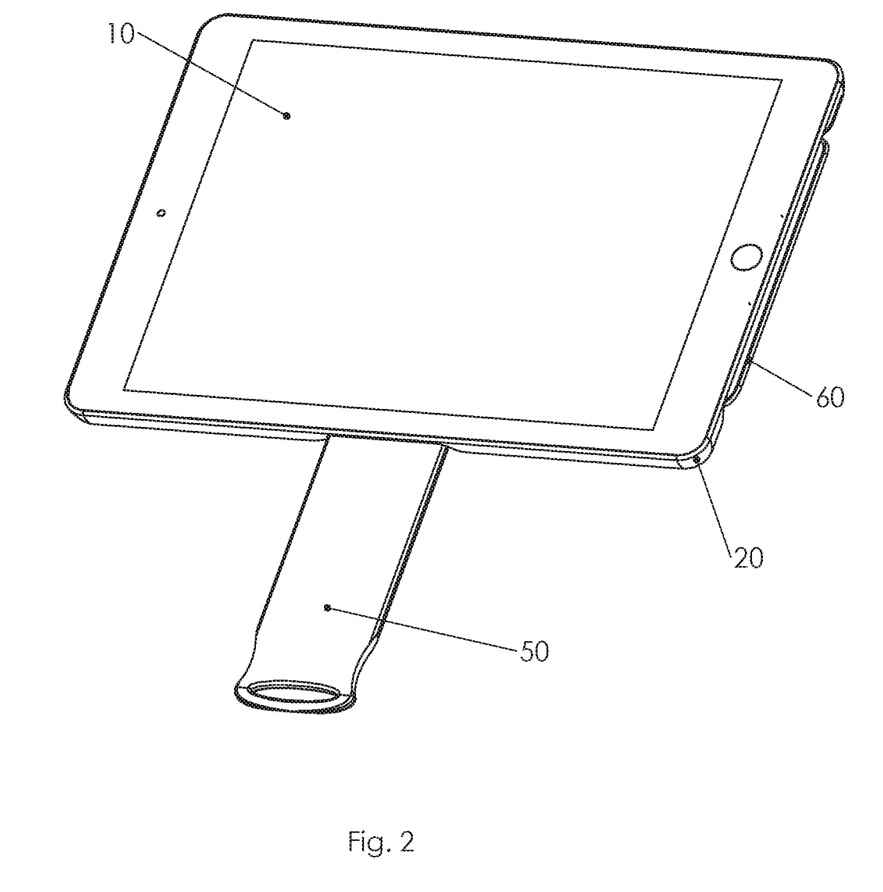
FIG. 2: This figure presents a top view of the entire invention showing the constituent elements 10, 20, 50, and 60 assembled as a unit, with the handgrip-strut fully deployed.
Figure 3:
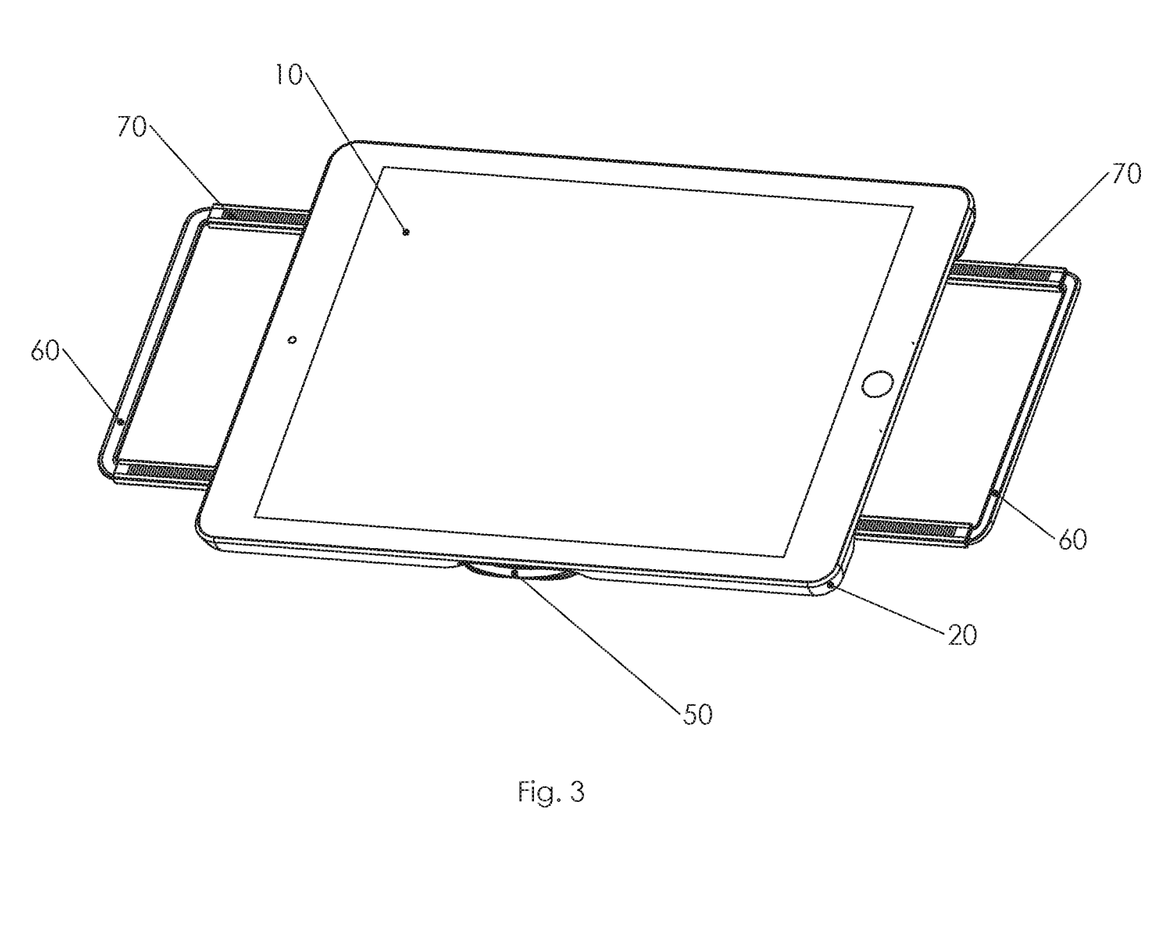
FIG. 3: This figure presents a top view of the device, clearly depicting components 10, 20, 40, 50, 60, and 70, with side handle-mounts 60 fully extended and deployed.
Figure 4:
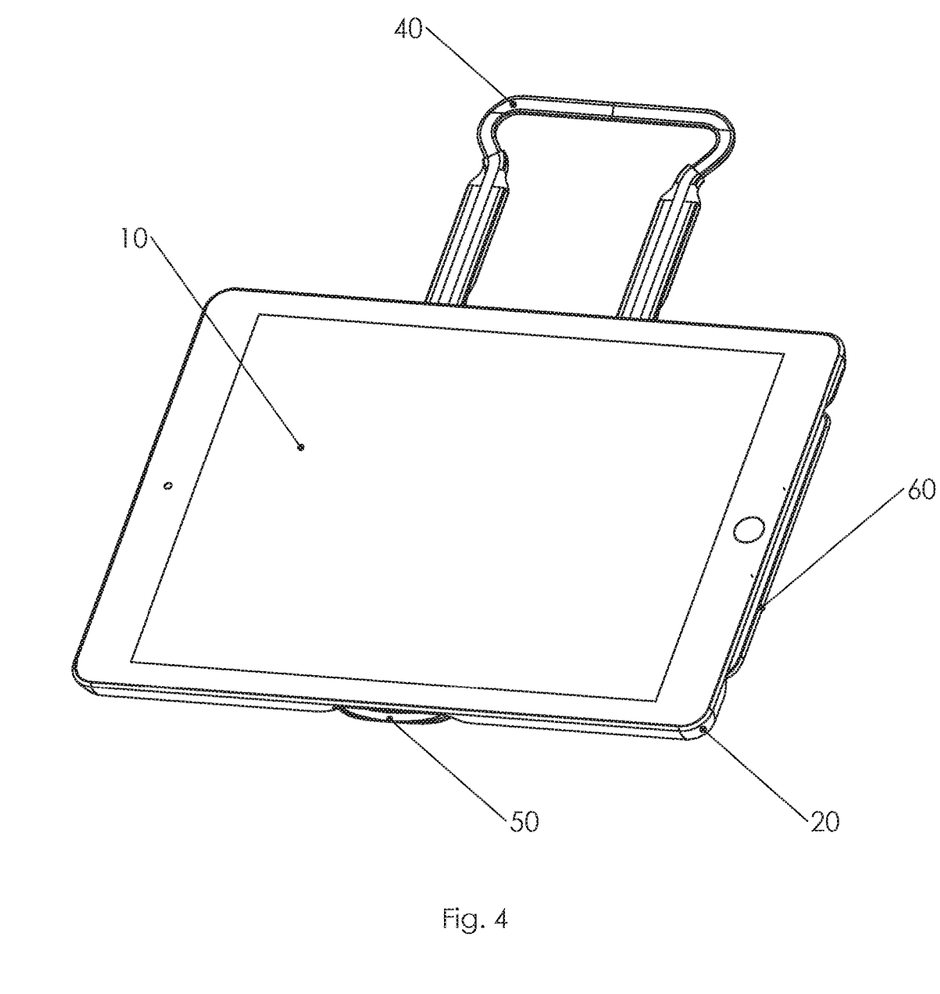
FIG. 4: This figure represents a top view of the inventive device showing top handle-mount 40 in a fully deployed position.
Figure 5:
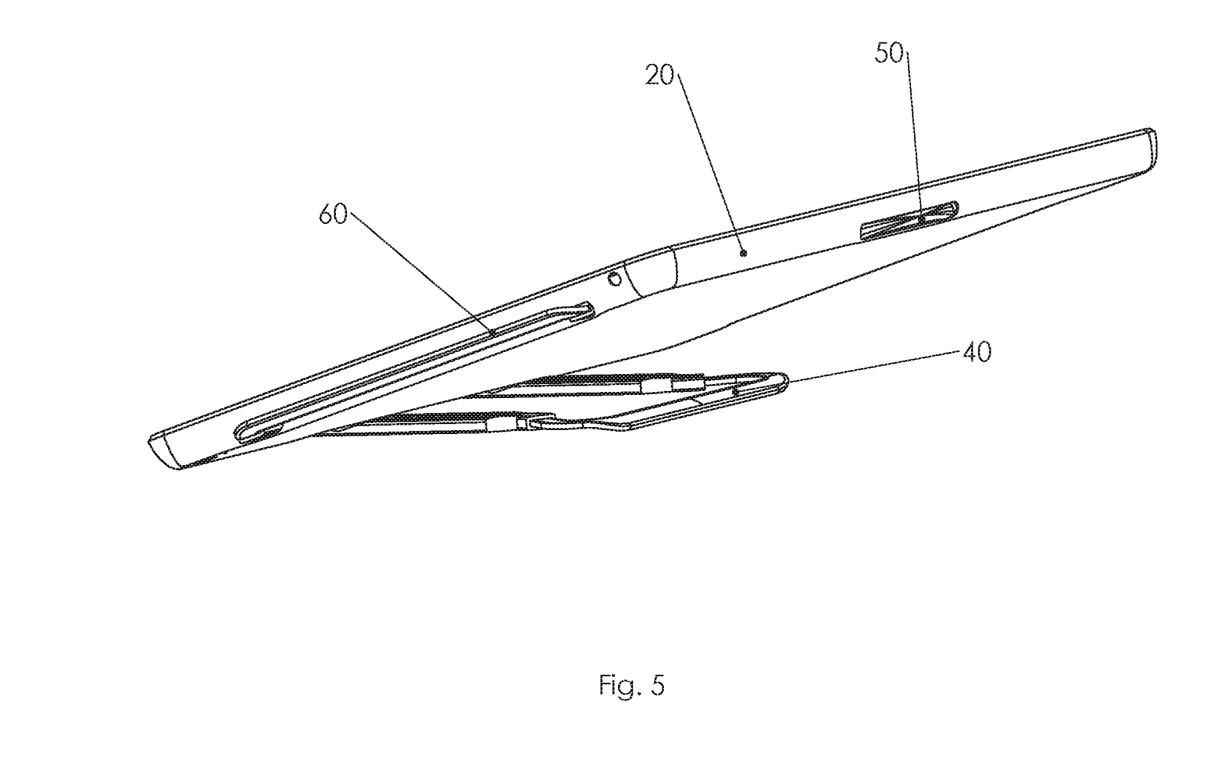
FIG. 5: This figure represents a side view of the invention, showing that top handle-mount 40 may be pivoted along an integral hinge point relative to the device, thus providing an angled stand for the overall device across a defined range of articulation.
Figure 6:
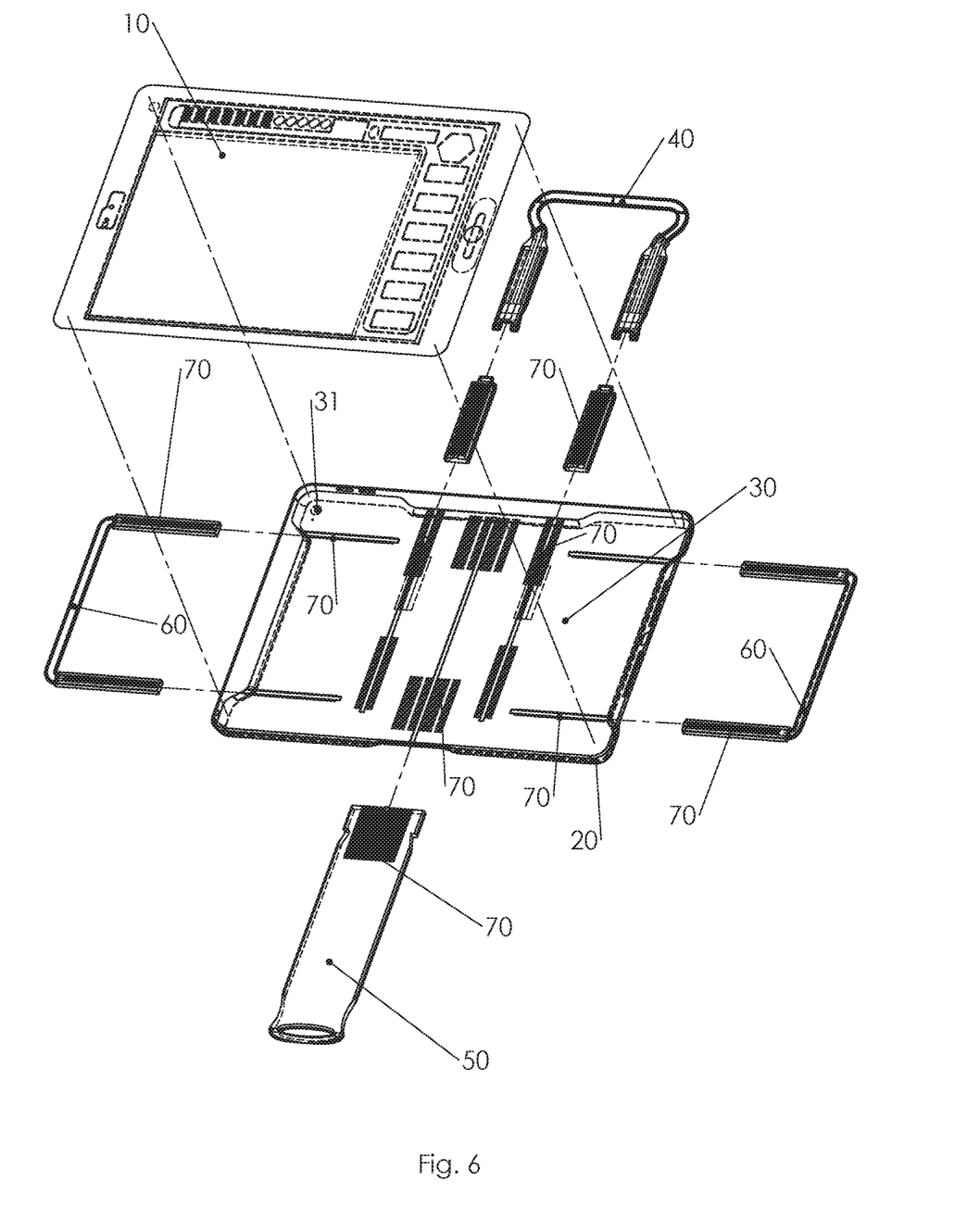
FIG. 6: This figure represents an exploded view of the inventive device, particularly illustrating the relationship of front housing 10 and associated electronic device componentry for illustrative purposes only, and the remainder of the inventive device's components, with all movable handle-mounts and similar components depicted in relation to their internal fitments, defined by integral friction members 70 embedded in the rear housing interior plate 30.
Figure 7:
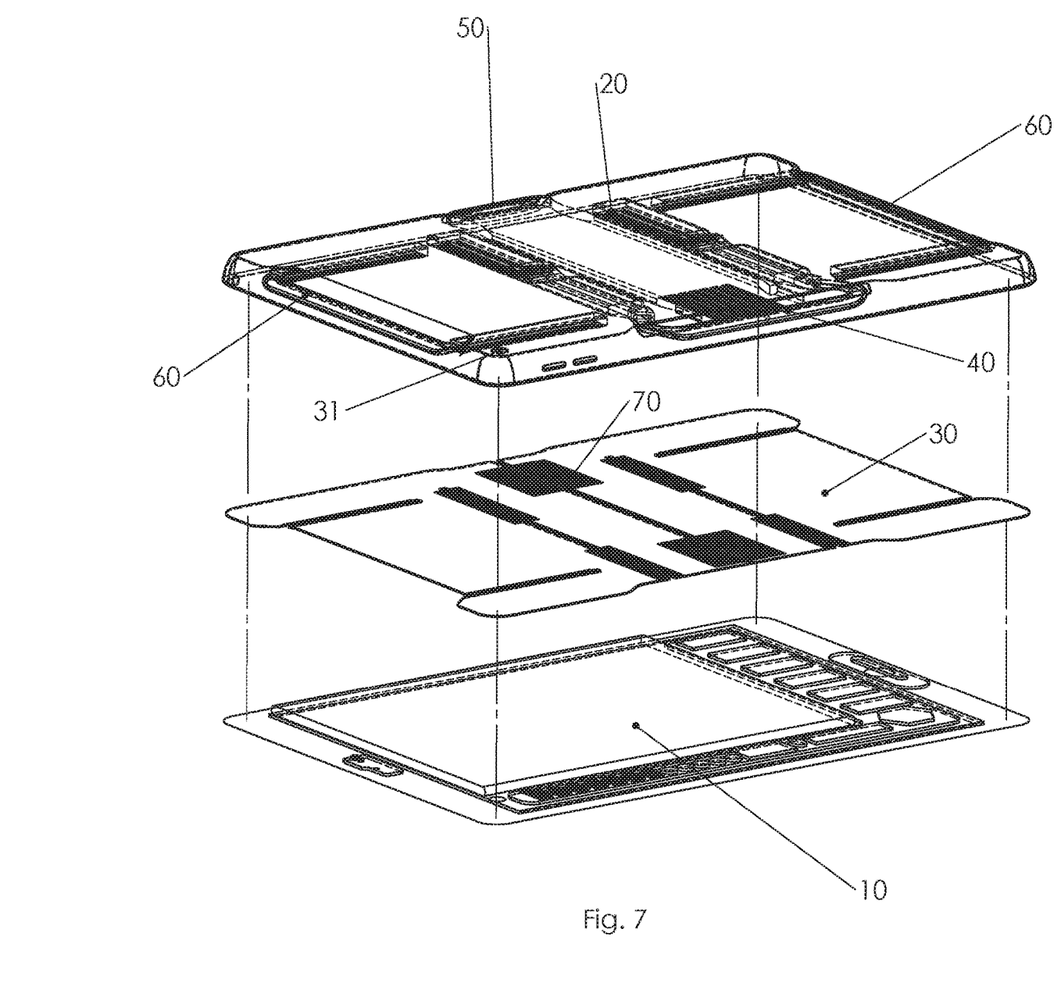
FIG. 7: This figure represents a partial exploded view of the inventive device, showing with particular emphasis the top handle-mount 40, handgrip strut 50, and side handle-mounts 60 in their "home" or retracted positions within the main body of the rear housing section 20.
Figure 8:
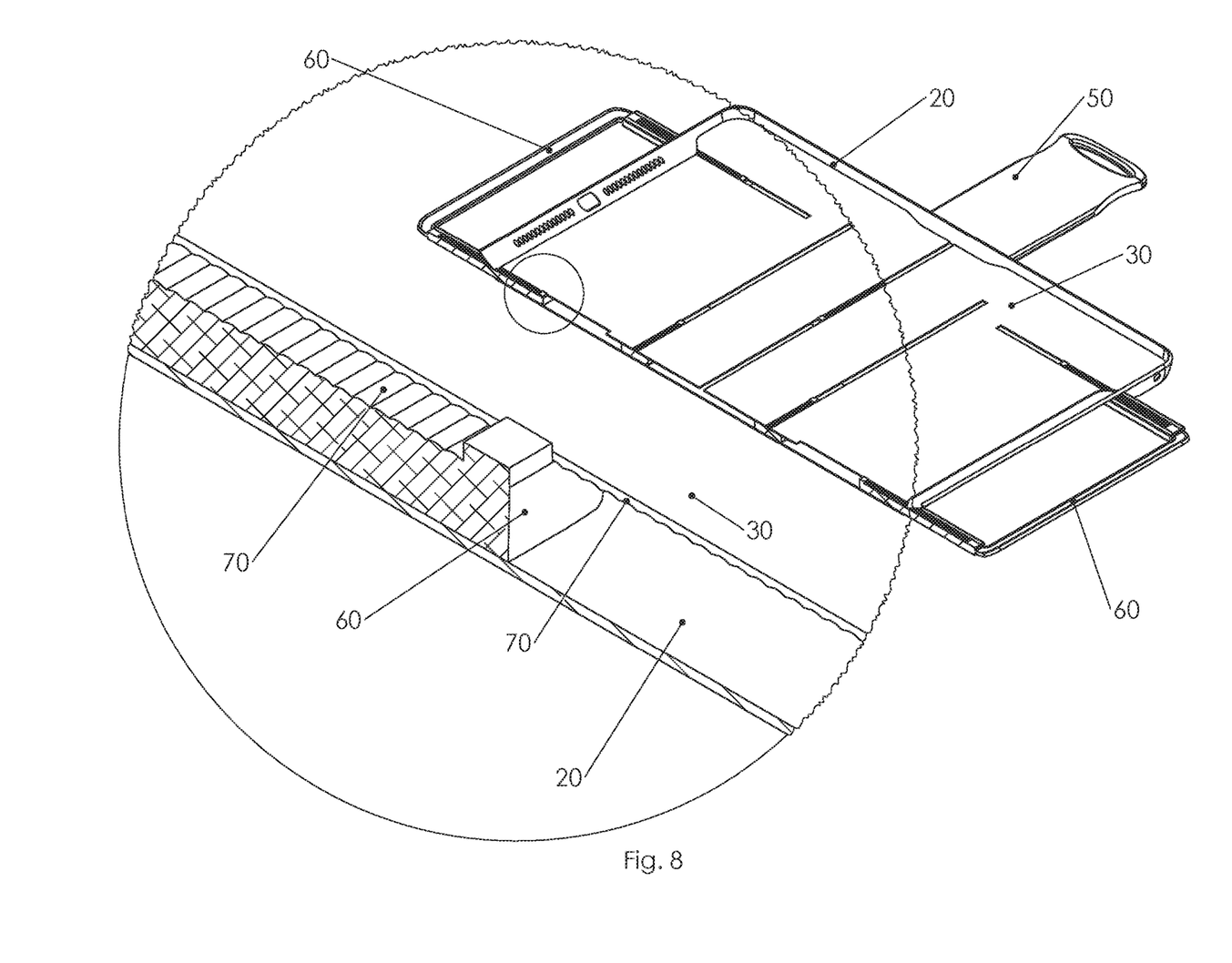
FIG. 8: This figure presents a close-up view of a side handle mount 60 with particular emphasis placed on the surface structure of friction member 70.

The invention is an advanced ergonomic housing for electronic devices which comprises a front protective screen/bezel assembly and a rear housing component, the interior backing plate of which receives a number of, retractable handles and handgrip elements, which may be partially articulated in such a manner as to also function as static or adjustable mounting points, struts, and bracing points.

The invention, in order of assembly, includes:
1. The front housing section 10, consisting of a frontal containment portion including components for inputs and outputs, a screen, and associated screen bezel, and associated peripherals hardware. The front housing section is a core element of the overall housing, mating seamlessly with the housing forming the rear of the device.
2. The rear housing section 20 which when joined to the screen and bezel encloses the circuitry, battery, sensors, audio input and output components, optics, and other componentry common to mobile phones, tablets, and similar devices.
3. The top handle-mount 40 which is received by the sub-assembly consisting of the device backing plate may be deployed outwardly in a variable graduated manner therefrom or fully retracted into the sub-assembly, in either case positively locking in place as desired by the operator by means of the partial static pressure applied by the friction members 70,
4. The side handle-mounts 60 which are received by the sub-assembly consisting of the device backing plate 20, permitting the operator to deploy the handle-mounts in a graduated manner outwardly from the sub-assembly or to fully retract the handle-mounts into the sub-assembly, in either case positively locking the handle-mounts in place as desired by the operator by means of the partial static pressure applied by the friction members 70,
5. The handgrip-strut 50 which is received by the sub-assembly consisting of the device backing plate 20 and integral backing plate 30, permitting the operator to deploy the handgrip-strut 50 in a graduated manner outwardly from the sub-assembly or to fully retract the handgrip-strut into the sub-assembly, in either case positively locking the handgrip-strut in place as desired by the operator by means of the partial static pressure applied by the friction member 70

In a broad embodiment, the present invention is a housing for electronic devices which provides the end user with a number of ergonomic, adjustable grasping and mounting points. While the foregoing written description of the invention enables one of ordinary skill to make and use what is considered presently to be the best mode thereof, those of ordinary skill will understand and appreciate the existence of variations, combinations, and equivalents of the specific embodiment, method, and examples herein. The invention should therefore not be limited by the above described embodiment, method, and examples, but by all embodiments and methods within the scope and spirit of the invention as claimed.

What is claimed is:

1. An advanced ergonomic original housing for electronic devices comprising, in combination: an impact resistant front housing section, and a mating rear housing section incorporating a series of receiving points for side and top handle mount and a handgrip-strut; wherein parts of the advanced ergonomic housing are integral, slidably deployable friction-fitted handles that concurrently may serve as mounting points and which may be selectively deployed and locked in an open, partially open, or retracted and closed position relative to the housing members, all of which are partly defined by a waveform-detent surfaces permitting friction-fitment, and which may be outwardly deployed along a predetermined range, and similarly retracted in full to the advanced ergonomic housing assembly; wherein said rear housing section features an interior-surface rear housing interior plate further defined by a series of textured channels of waveform detent surface structure being in direct communication with side and top handle mounts and a handgrip-strut element, such that these are slidably connected to said advanced ergonomic housing; wherein said side- and top-handle-mounts and handgrip-strut are locked as desired by means of textured waveform detents, which encloses and contains all necessary components of a computer tablet electronic device including all peripherals customary to such devices including optics, battery, haptic elements, digital inputs and outputs, sensors, memory, and processing units, as well as radio communications and radio frequency identification elements including radio frequency reading elements, wherein said advanced ergonomic housing has at least one aperture to permit access to an optical lens of an electronic device, wherein said front housing section, rear housing section, and said side- and top-handle-mounts, and said handgrip-strut are of a rigid or semi-rigid, machine-formed material.

* * * * *